(12) United States Patent
Lin et al.

(10) Patent No.: US 11,664,399 B2
(45) Date of Patent: May 30, 2023

(54) SOLID-STATE IMAGE SENSOR

(71) Applicant: VisEra Technologies Company Limited, Hsin-Chu (TW)

(72) Inventors: Cheng-Hsuan Lin, Taipei (TW); Yu-Chi Chang, Hukou Township, Hsinchu County (TW); Zong-Ru Tu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 104 days.

(21) Appl. No.: 17/164,114

(22) Filed: Feb. 1, 2021

(65) Prior Publication Data
US 2022/0246657 A1 Aug. 4, 2022

(51) Int. Cl.
*H01L 27/146* (2006.01)
(52) U.S. Cl.
CPC .... *H01L 27/14621* (2013.01); *H01L 27/1463* (2013.01); *H01L 27/14627* (2013.01)
(58) Field of Classification Search
None
See application file for complete search history.

(56) References Cited

U.S. PATENT DOCUMENTS

| 9,985,072 B1* | 5/2018 | Wen .................. H01L 27/14623 |
| 2017/0092684 A1 | 3/2017 | Chang et al. |
| 2017/0301718 A1 | 10/2017 | Chou et al. |
| 2019/0131333 A1 | 5/2019 | Borthakur et al. |
| 2019/0148430 A1 | 5/2019 | Chu et al. |
| 2019/0148434 A1* | 5/2019 | Hsu ................... H01L 27/14629 257/432 |
| 2021/0144321 A1* | 5/2021 | Yamashita ........... H04N 25/772 |

(Continued)

FOREIGN PATENT DOCUMENTS

| CN | 109661727 A | 4/2019 |
| CN | 110875342 A | 3/2020 |

(Continued)

OTHER PUBLICATIONS

Office Action dated Jan. 7, 2022 in TW Application No. 110119656, 8 pages.

*Primary Examiner* — Ali Naraghi
(74) *Attorney, Agent, or Firm* — Muncy, Geissler, Olds & Lowe, P.C.

(57) ABSTRACT

The solid-state image sensor includes a semiconductor substrate having first and second photoelectric conversion elements, a color filter layer, and a hybrid layer. The isolation structure is disposed between the first and second photoelectric conversion elements. The color filter layer is disposed above the semiconductor substrate. The hybrid layer is disposed between the semiconductor substrate and the color filter layer. The hybrid layer includes a first partition structure, a second partition structure, and a transparent layer. The first partition structure is disposed to correspond to the isolation structure. The second partition structure is surrounded by the first partition structure. The transparent layer is between the first partition structure and the second partition structure. The refractive index of the first partition structure and the refractive index of the second partition structure are lower than the refractive index of the transparent layer.

20 Claims, 11 Drawing Sheets

(56) References Cited

U.S. PATENT DOCUMENTS

| | | | |
|---|---|---|---|
| 2021/0202546 A1* | 7/2021 | Liu | H01L 27/1463 |
| 2021/0280625 A1* | 9/2021 | Park | H01L 27/1463 |
| 2022/0246659 A1* | 8/2022 | Inoue | H01L 27/14625 |

FOREIGN PATENT DOCUMENTS

| | | |
|---|---|---|
| CN | 111357112 A | 6/2020 |
| JP | 2014116472 A | 6/2014 |
| JP | 2017011207 A | 1/2017 |
| JP | 2019-140251 | 8/2019 |
| KR | 1020190055732 | 5/2019 |
| TW | 202007140 A | 2/2020 |
| WO | WO2019/039177 | 2/2019 |

* cited by examiner

SOLID-STATE IMAGE SENSOR

BACKGROUND

Technical Field

The embodiments of the present disclosure relate to image sensors, and in particular they relate to solid-state image sensors that include a hybrid layer.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras and digital video cameras. The light-sensing portion of the solid-state image sensor may be formed at each of the pixels, and signal electric charges may be generated according to the amount of light received by the light-sensing portion. In addition, the signal electric charges generated in the light-sensing portion may be transmitted and amplified, whereby an image signal may be obtained.

In solid-state image sensors, light having different wavelengths may be absorbed at different depths of the semiconductor substrate. However, when an inclined incident light enters the solid-state image sensor, this behavior may cause an energy imbalance in two adjacent photoelectric conversion elements that are formed for absorbing the same color. Therefore, there are still various challenges in the design and manufacturing of solid-state image sensors.

BRIEF SUMMARY

In some embodiments of the present disclosure, the solid-state image sensor includes a hybrid layer disposed between the semiconductor substrate and the color filter layer, which may help to separate light from the color filter layer (color filter segment), thereby improving the uniformity of sensitivity of the photoelectric conversion elements to enhance the quality of the image signal from the photoelectric conversion elements of the solid-state image sensors.

In accordance with some embodiments of the present disclosure, a solid-state image sensor is provided. The solid-state image sensor includes a semiconductor substrate having first photoelectric conversion elements and at least one second photoelectric conversion element. The solid-state image sensor also includes an isolation structure disposed between the first photoelectric conversion elements and the second photoelectric conversion element. The solid-state image sensor further includes a color filter layer disposed above the semiconductor substrate and having a first color filter segment corresponding to the first photoelectric conversion elements and a second color filter segment corresponding to the second photoelectric conversion element. Moreover, the solid-state image sensor also includes a hybrid layer disposed between the semiconductor substrate and the color filter layer. The hybrid layer includes a first partition structure disposed so that it corresponds to the isolation structure. The hybrid layer also includes a second partition structure that is surrounded by the first partition structure. The hybrid layer further includes a transparent layer located between the first partition structure and the second partition structure. The refractive index of the first partition structure and the refractive index of the second partition structure are lower than the refractive index of the transparent layer.

In some embodiments, the height of the second partition structure is lower than the height of the first partition structure.

In some embodiments, from the cross-sectional view of the solid-state image sensor, the first partition structure includes first partition segments, the second partition structure includes second partition segments, and each first partition segment and each second partition segment have different shapes.

In some embodiments, each first partition segment is formed into a rectangle, and each second partition segment is formed into a triangle or a semi-circle.

In some embodiments, from the top view of the hybrid layer, the second partition structure is formed into a square, a rectangle, or two cross rectangles.

In some embodiments, the second partition structure is in direct contact with the first partition structure.

In some embodiments, the height of the second partition structure is higher than the height of the first partition structure.

In some embodiments, a portion of the second partition structure is disposed inside the first color filter segment.

In some embodiments, the semiconductor substrate has second photoelectric conversion elements, and the second partition structure corresponds to the first photoelectric conversion elements or the second photoelectric conversion elements.

In some embodiments, the first color filter segment and the second color filter segment include red color filter segment, green color filter segment, blue color filter segment, yellow color filter segment, white color filter segment, cyan color filter segment, magenta color filter segment, or IR/NIR color filter segment.

In some embodiments, the height of the first partition structure is constant, and the height of the second partition structure is variable.

In some embodiments, the height of the second partition structure corresponding to the first color filter segment is different from the height of the second partition structure corresponding to the second color filter segment.

In some embodiments, the solid-state image sensor further includes a condensing structure disposed on the color filter layer. The condensing structure includes a first micro-lens corresponding to the first photoelectric conversion elements and a second micro-lens corresponding to the second photoelectric conversion element.

In some embodiments, the first micro-lens corresponds to m×n first photoelectric conversion elements, and m and n are positive integers.

In some embodiments, the second micro-lens corresponds to one second photoelectric conversion element.

In some embodiments, the first partition structure has a shift with respect to the isolation structure in an edge area of the solid-state image sensor.

In some embodiments, the solid-state image sensor further includes a metal grid disposed at the bottom of the first partition structure.

In some embodiments, the refractive index of the transparent layer is greater than 1.0.

In some embodiments, the refractive index of the first partition structure and the refractive index of the second partition structure are different.

In some embodiments, the thickness of the hybrid layer is in a range from 0.01 µm to 2.0 µm.

BRIEF DESCRIPTION OF THE DRAWINGS

The disclosure can be more frilly understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
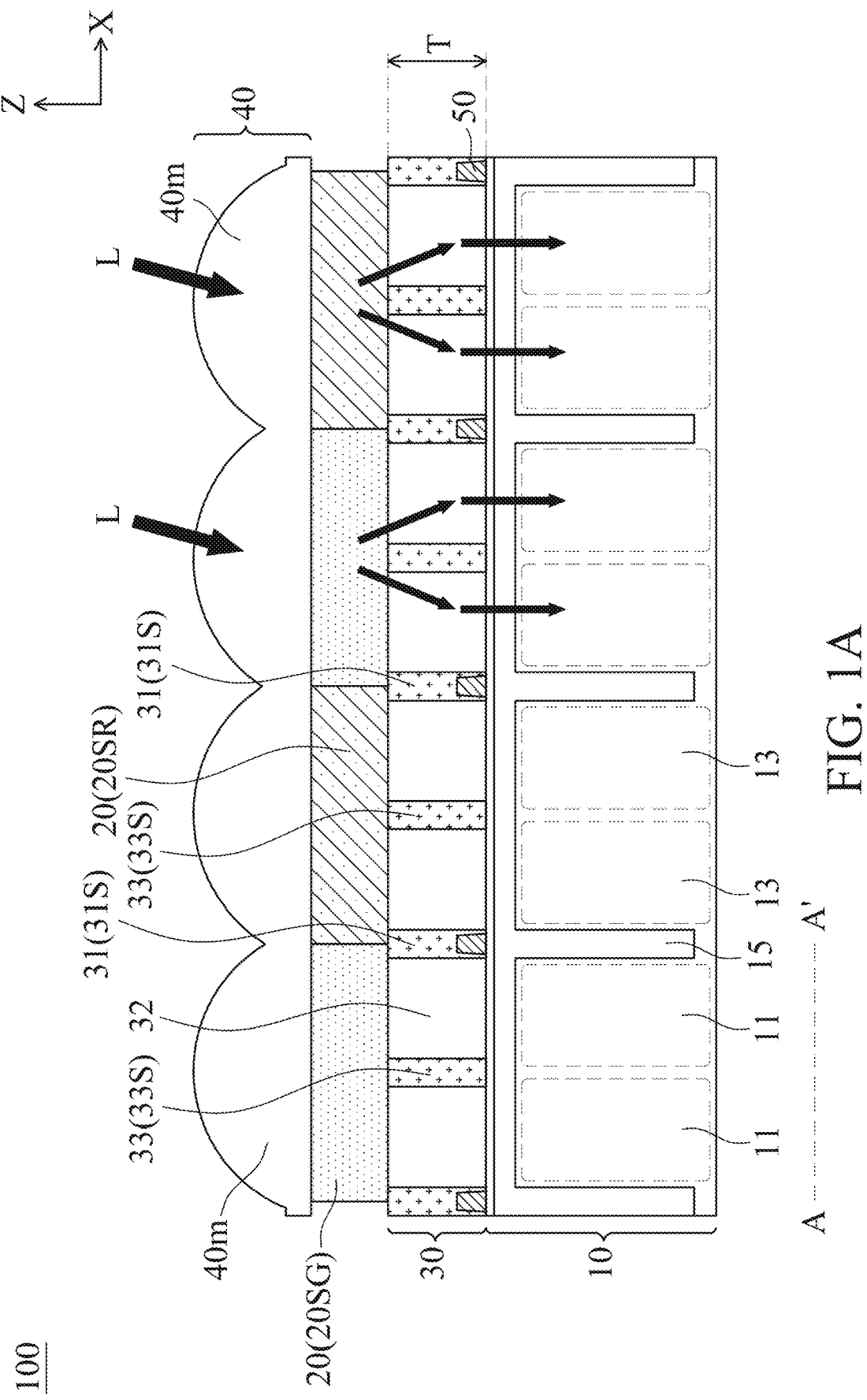
FIG. 1A is a cross-sectional view illustrating a portion of the solid-state image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1B:
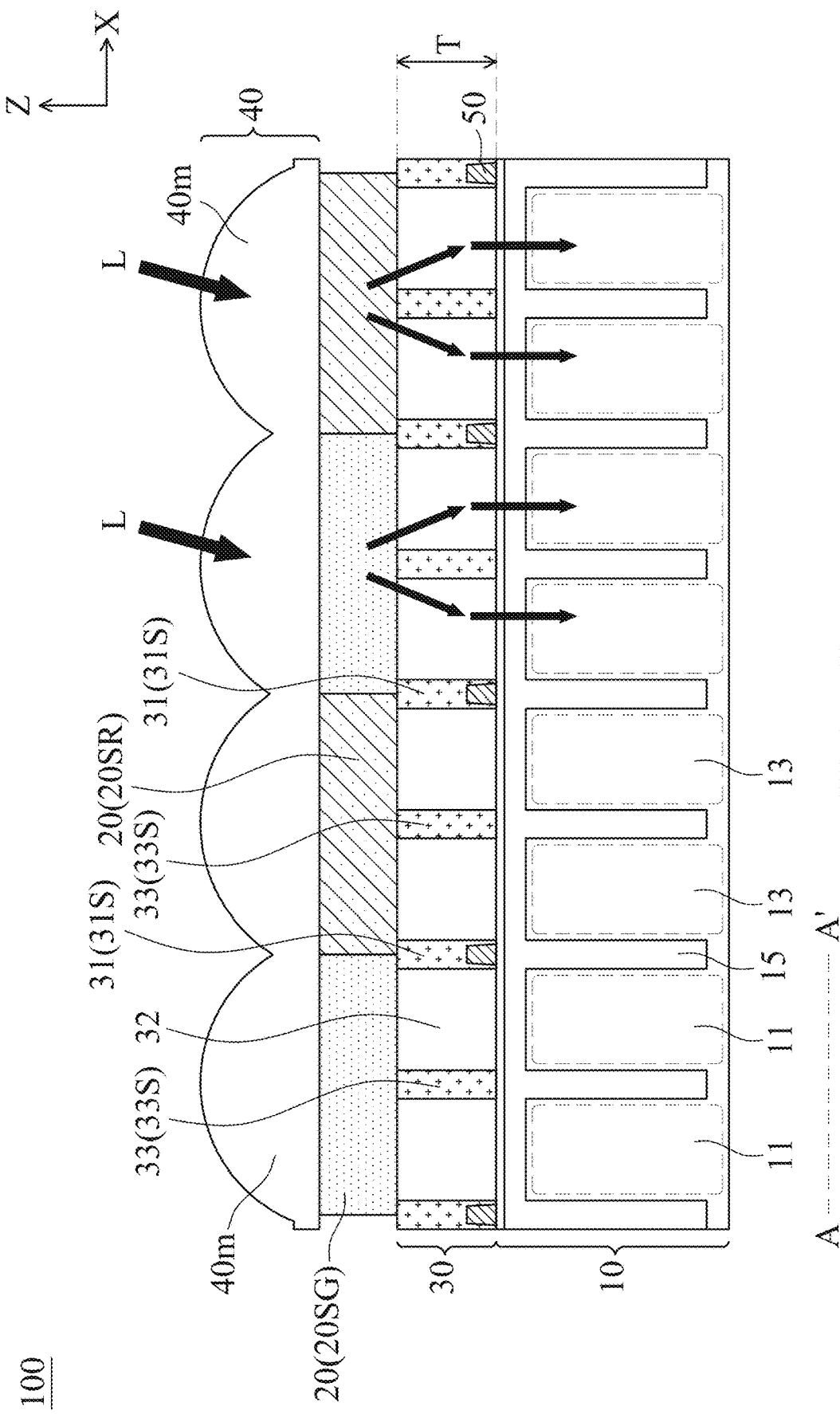
FIG. 1B is a cross-sectional view illustrating a portion of the solid-state image sensor in accordance with some embodiments of the present disclosure.
Figure 2:
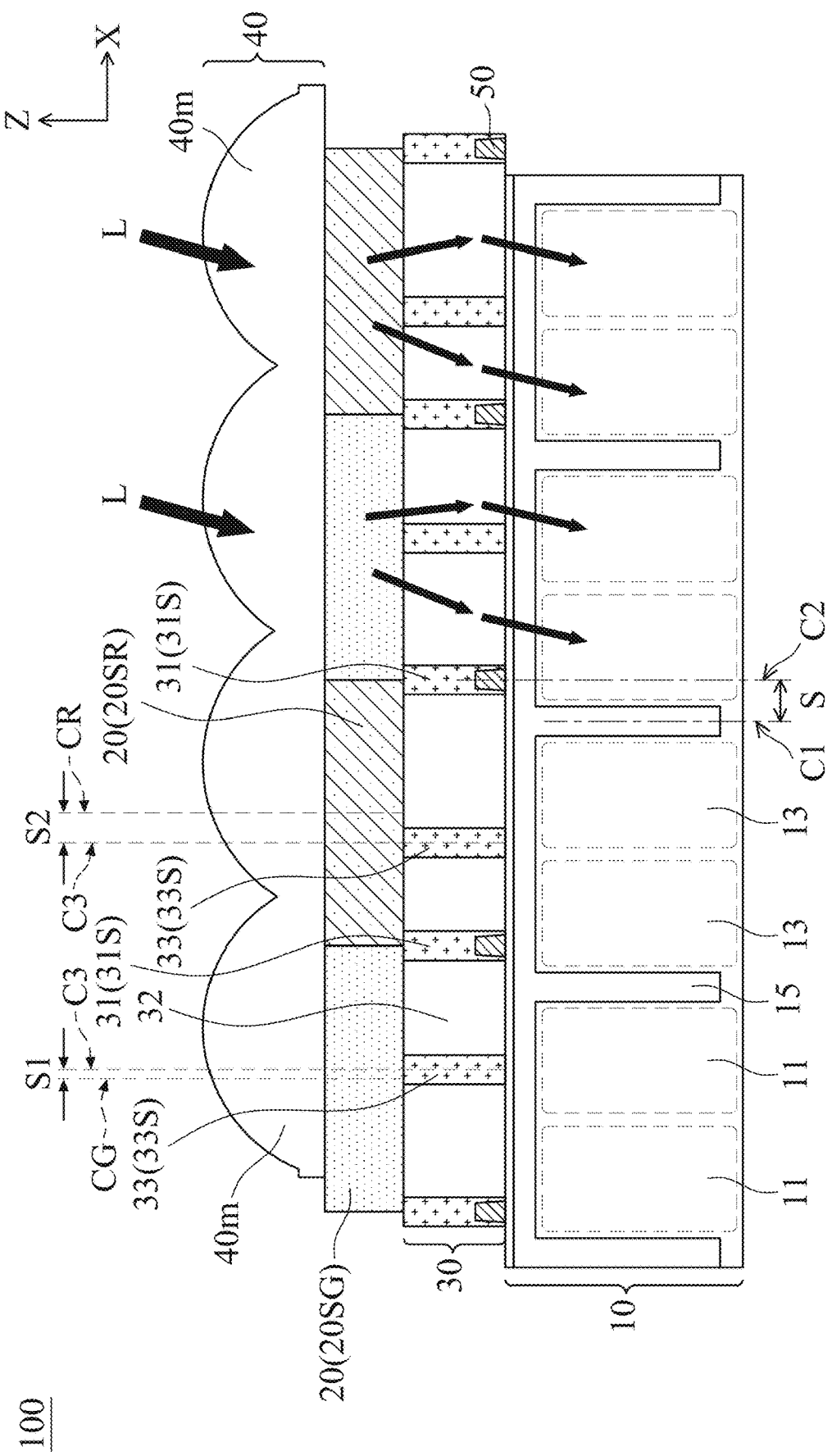
FIG. 2 is a cross-sectional view illustrating another portion of the solid-state image sensor in accordance with some embodiments of the present disclosure.

FIG. 1A and FIG. 1B are cross-sectional views illustrating a portion of the solid-state image sensor 100 in accordance with some embodiments of the present disclosure. FIG. 2 is a cross-sectional view illustrating another portion of the solid-state image sensor 100 in accordance with some embodiments of the present disclosure. For example, FIG. 1A and FIG. 1B show the cross-sectional views of the solid-state image sensor 100 in the center area, and FIG. 2 shows the cross-sectional view of the solid-state image sensor 100 in the edge area that surrounds the center area, but the present disclosure is not limited thereto. It should be noted that some components of the solid-state image sensor 100 may be omitted in FIG. 1A, FIG. 1B and FIG. 2 for the sake of brevity.

In some embodiments, the solid-state image sensor 100 may be a complementary metal-oxide semiconductor (CMOS) image sensor or a charge coupled device (CCD) image sensor, but the present disclosures is not limited thereto.

Referring to FIG. 1A, FIG. 1B and FIG. 2, the solid-state image sensor 100 includes a semiconductor substrate 10. In some embodiments, the semiconductor substrate 10 may be a wafer or a chip. For example, the semiconductor substrate 10 may include silicon, but the present disclosure is not limited thereto. As shown in FIG. 1A, FIG. 1B and FIG. 2, the semiconductor substrate 10 may have first photoelectric conversion elements 11 and second photoelectric conversion elements 13. In some embodiments, the first photoelectric conversion elements 11 and the second photoelectric conversion elements 13 may be photodiodes for receiving different colors. For example, the first photoelectric conversion elements 11 may be used for receiving green light, and the second photoelectric conversion elements 13 may be used for receiving red light, but the present disclosure is not limited thereto. In some other embodiments, the first photoelectric conversion elements 11 and the second photoelectric conversion elements 13 may be photodiodes for receiving the same color. For example, both the first photoelectric conversion elements 11 and the second photoelectric conversion elements 13 may be used for receiving green light for phase detection auto focus (PDAF) function.

Referring to FIG. 1A, FIG. 1B and FIG. 2, the solid-state image sensor 100 includes an isolation structure 15 disposed between the first photoelectric conversion element 11 and the second photoelectric conversion element 13. In some embodiments, the isolation structure 15 may include a shallow trench isolation (STI) or a deep trench isolations (DTI). For example, the isolation structure 15 may be formed in the semiconductor substrate 10 using etching process to form trenches and filling the trenches with an insulating or dielectric material, but the present disclosure is not limited thereto.

As shown in FIG. 1A and FIG. 2, the isolation structure 15 may separate the first photoelectric conversion element 11 and the second photoelectric conversion element 13. That is, the first photoelectric conversion elements 11 and the second photoelectric conversion elements 13 in the semiconductor substrate 10 may be isolated from each other by the isolation structure 15, but the present disclosure is not limited thereto.

As shown in FIG. 1B, the isolation structure 15 may also be disposed between the first photoelectric conversion elements 11. That is, the isolation structure 15 may separate the first photoelectric conversion elements 11 from each other. Alternately, the isolation structure 15 may also be disposed between the second photoelectric conversion elements 13. That is, the isolation structure 15 may separate the second photoelectric conversion elements 13 from each other.

Referring to FIG. 1A, FIG. 1B and FIG. 2, the solid-state image sensor 100 includes a color filter layer 20 disposed above the semiconductor substrate 10. In some embodiments, as shown in FIG. 1A, FIG. 1B and FIG. 2, the color filter layer 20 may have green color filter segments 20SG that correspond to the first photoelectric conversion elements 11 and red color filter segments 20SR that correspond to the second photoelectric conversion elements 13, but the present disclosure is not limited thereto.

In some embodiments, the color filter layer 20 may have blue color filter segments, yellow color filter segments, white color filter segments, cyan color filter segments, magenta color filter segments, IR/NIR color filter segment, or other applicable color filter segments that correspond to the first photoelectric conversion elements 11 or the second photoelectric conversion elements 13. For example, some color filter segments of the color filter layer 20 may correspond to one of red, green and blue, and other color filter segments of the color filter layer 20 may correspond to another of red, green and blue, but the present disclosure is not limited thereto.

Referring to FIG. 1A, FIG. 1B and FIG. 2, the solid-state image sensor 100 includes a hybrid layer 30 disposed between the semiconductor substrate 10 and the color filter layer 20. In particular, the hybrid layer 30 includes a first partition structure 31, a second partition structure 33, and a transparent layer 32. As shown in FIG. 1A, FIG. 1B and FIG. 2, the first partition structure 31 may be disposed so that it corresponds to the isolation structure 15, the second partition structure 33 may correspond to the first photoelectric conversion elements 11 or the second photoelectric conversion elements 13, and the transparent layer 32 may be between the first partition structure 31 and the second partition structure 33, but the present disclosure is not limited thereto.

In the embodiments of the present disclosure, the refractive index of the first partition structure 31 and the refractive index of the second partition structure 33 are lower than the refractive index of the transparent layer 32. For example, the refractive index of the first partition structure 31 and the refractive index of the second partition structure 33 may be in a range from about 1.0 to about 1.99, and the refractive index of the transparent layer 32 may be greater than about 1.0 (e.g., about 3.0), but the present disclosure is not limited thereto.

In some embodiments, the first partition structure 31 and/or the second partition structure 33 may be formed by depositing a dielectric layer on the semiconductor substrate 10 and then patterning the dielectric layer using photolithography and etching processes to form the first partition structure 31 and/or the second partition structure 33, but the present disclosure is not limited thereto.

In some embodiments, the material of the first partition structure 31 and the material of the second partition structure 33 may be the same, but the present disclosure is not limited thereto. In some other embodiments, the material of the first partition structure 31 and the material of the second partition structure 33 may be different. That is, the refractive index of the first partition structure 31 and the refractive index of the second partition structure 33 may be different.

In some embodiments, the transparent layer 32 may be an organic layer, but the present disclosure is not limited thereto. In some embodiments, the material of the transparent layer 32 may include glass, epoxy resin, silicone resin, polyurethane, any other applicable material, or a combination thereof, but the present disclosure is not limited thereto. The transparent layer 127 may be formed by a deposition process.

In the embodiment shown in FIG. 1A, FIG. 1B and FIG. 2, the first partition structure 31 and the second partition structure 33 may have the same height, but the present disclosure is not limited thereto. In some embodiment, as shown in FIG. 1A and FIG. 1B, the thickness T of the hybrid layer 30 may be in a range from about 0.01 μm to about 2.0 μm. That is, the height of the first partition structure 31 and the height of the second partition structure 33 may be in a range from about 0.01 μm to about 2.0 μm, but the present disclosure is not limited thereto.

In some embodiments, the structure of the solid-state image sensor 100 may have a shift in the edge area of the solid-state image sensor 100. For example, as shown in FIG. 2, the first partition structure 31 may have a shift S with respect to the isolation structure 15 in the edge area of the solid-state image sensor 100. In other words, in the cross-sectional view as shown in FIG. 2, the distance between the central axial C2 of the first partition structure 31 and the central axial C1 of the isolation structure 15 may be the shift S, but the present disclosure is not limited thereto.

Moreover, as shown in FIG. 2, the second partition structure 33 may have a shift S1 with respect to the central axial CG of the green color filter segments 20SG, and have a shift S2 with respect to the central axial CR of the red color filter segments 20SR in the edge area of the solid-state image sensor 100. In other words, in the cross-sectional view as shown in FIG. 2, the distance between the central axial C3 of the second partition structure 33 and the central axial CG of the green color filter sear 20SG may be the shift S1, and the distance between the central axial C3 of the second partition structure 33 and the central axial CR of the red color filter segments 20SR may be the shift S2, but the present disclosure is not limited thereto. In some embodiments, the shift S1 and the shift S2 may be different, and both the shift S1 and the shift S2 may be different from the shift S, but the present disclosure is not limited thereto.

Similarly, as shown in FIG. 2, the color filter layer 20 may also have a shift S with respect to the isolation structure 15 in the edge area of the solid-state image sensor 100. However, the shift of the color filter layer 20 with respect to the isolation structure 15 may be different from the shift S, which may be adjusted depending on actual need.

As shown in FIG. 1A, FIG. 1B and FIG. 2, after incident light L enters the solid-state image sensor 100 and passes through the green color filter segment 20SG or the red color filter segment 20SG, it may be separated by the second partition structure 33, thereby improving the uniformity of sensitivity of the first photoelectric conversion elements 11 and the second photoelectric conversion elements 13, and enhancing the quality of the image signal from the first photoelectric conversion elements 11 and the second photoelectric conversion elements 13 of the solid-state image sensors 100.

In some embodiments, as shown in FIG. 1A, FIG. 1B and FIG. 2, the solid-state image sensor 100 may include a metal grid 50 disposed on the semiconductor substrate 10. In particular, the metal grid 50 is disposed at the bottom of the first partition structure 31. In some embodiments, the material of the metal grid 50 may include tungsten (W), aluminum (Al), metal nitride (e.g., titanium nitride (TiN)), other suitable materials, or a combination thereof, but the present disclosure is not limited thereto. The metal grid 50 may be formed by depositing a metal layer on the semiconductor substrate 10 and then patterning the metal layer using photolithography and etching processes to form the metal grid 50, but the present disclosure is not limited thereto.

In some embodiments, as shown in FIG. 1A, FIG. 1B and FIG. 2, the solid-state image sensor 100 may further include a condensing structure 40 disposed on the color filter layer 20. In some embodiments, the condensing structure 40 may be used for condensing incident light L. In some embodiments, the material of the condensing structure 40 may be the same as or similar to the material of the transparent layer 32. For example, the material of the condensing structure 40 may include glass, epoxy resin, silicone resin, polyurethane, any other applicable material, or a combination thereof, but the present disclosure is not limited thereto. In some embodiments, the condensing structure 40 may be formed by a photoresist reflow method, a hot embossing method, any other applicable method, or a combination thereof. In, some embodiments, the steps of forming the condensing structure 40 may include a spin coating process, a lithography process, an etching process, any other applicable process, or a combination thereof, but the present disclosure is not limited thereto.

In some embodiments, as shown in FIG. 1A, FIG. 1B and FIG. 2, the condensing structure 40 may include micro-lenses 40m that correspond to the first photoelectric conversion elements 11 and the second photoelectric conversion elements 13. For example, each micro-lens 40m may correspond to four (2×2) first photoelectric conversion elements 11 or four (2×2) second photoelectric conversion elements 13, but the present disclosure is not limited thereto. In some embodiments, the micro-lens 40m may correspond to m×n first photoelectric conversion elements 11 or m×n second photoelectric conversion elements 13, and m and n are positive integers, but the present disclosure is not limited thereto. In some other embodiments, the micro-lens 40m may correspond to one second photoelectric conversion element 13.

In some embodiments, the micro-lens 40m may be a semi-convex lens or a convex lens, but the present disclosure is not limited thereto. In some other embodiments, the condensing structure 40 may include micro-pyramid structures (e.g., circular cone, quadrangular pyramid, and so on), or micro-trapezoidal structures (e.g., flat top cone, truncated square pyramid, and so on). Alternatively, the condensing structure 40 may be a gradient-index structure.

Similarly, as shown in FIG. 2, the condensing structure 40 may have a shift with respect to the color filter layer 20 in the edge area of the solid-state image sensor 100. However, the shift of the condensing structure 40 with respect to the color filter layer 20 may be different from the shift S, which may be adjusted depending on actual need.

Figure 3A:
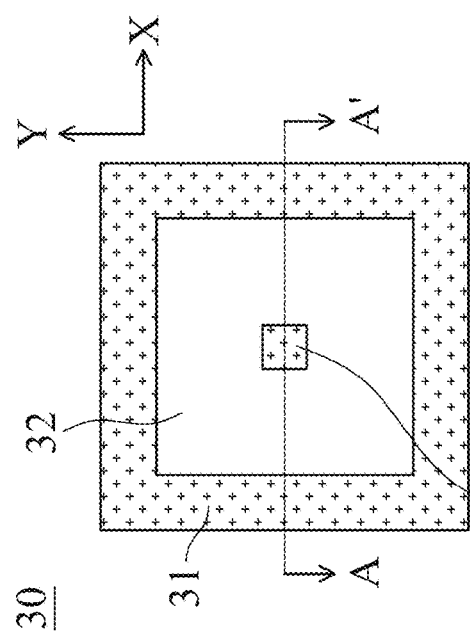
FIG. 3A is a partial top view illustrating the hybrid layer according to one embodiment of the disclosure.
Figure 3B:
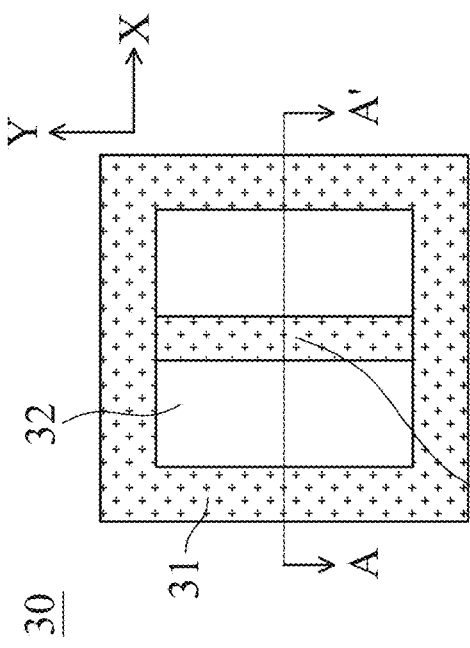
FIG. 3B is a partial top view illustrating the hybrid layer according to another embodiment of the disclosure.
Figure 3C:
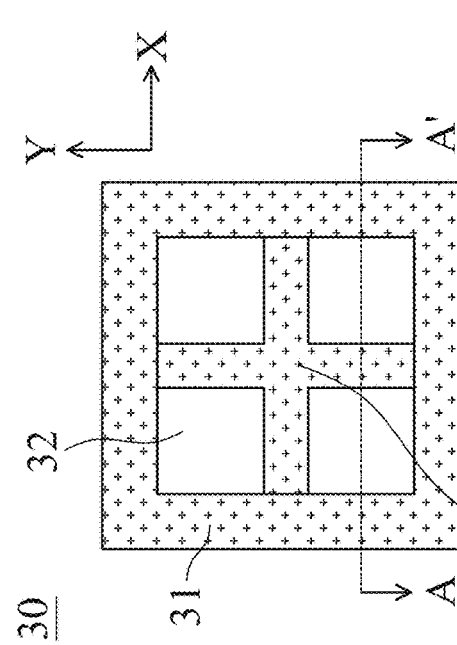
FIG. 3C is a partial top view illustrating the hybrid layer according to still another embodiment of the disclosure.

FIG. 3A is a partial top view illustrating the hybrid layer 30 according to one embodiment of the disclosure. FIG. 3B is a partial top view illustrating the hybrid layer 30 according to another embodiment of the disclosure. FIG. 3C is a partial top view illustrating the hybrid layer 30 according to still another embodiment of the disclosure. For example, FIG. 1A, FIG. 1B and FIG. 2 may include a partial cross-sectional view of the hybrid layer 30 along line A-A' in FIG. 3A, FIG. 3B or FIG. 3C, but the present disclosure is not limited thereto.

Referring to FIG. 3A to FIG. 3C, the second partition structure 33 is surrounded by the first partition structure 31. In some embodiments, as shown in FIG. 3A, from the top view of the hybrid layer 30, the second partition structure 33 may be formed into a square that is separated from the first partition structure 31, but the present disclosure is not limited thereto.

In some embodiments, as shown in FIG. 3B, from the top view of the hybrid layer 30, the second partition structure 33 may be formed into a rectangle that is connected to the first partition structure 31. That is, the second partition structure 33 may be in direct contact with the first partition structure 31, but the present disclosure is not limited thereto.

In some embodiments, as shown in FIG. 3C, from the top view of the hybrid layer 30, the second partition structure 33 may be formed into two cross rectangles that are both connected to the first partition structure 31. That is, the second partition structure 33 may be in direct contact with the first partition structure 31, but the present disclosure is not limited thereto.

In some other embodiments, from the top view of the hybrid layer 30, the second partition structure 33 may be formed into other polygons that may be separated from or connected to the first partition structure 31.

Figure 4:
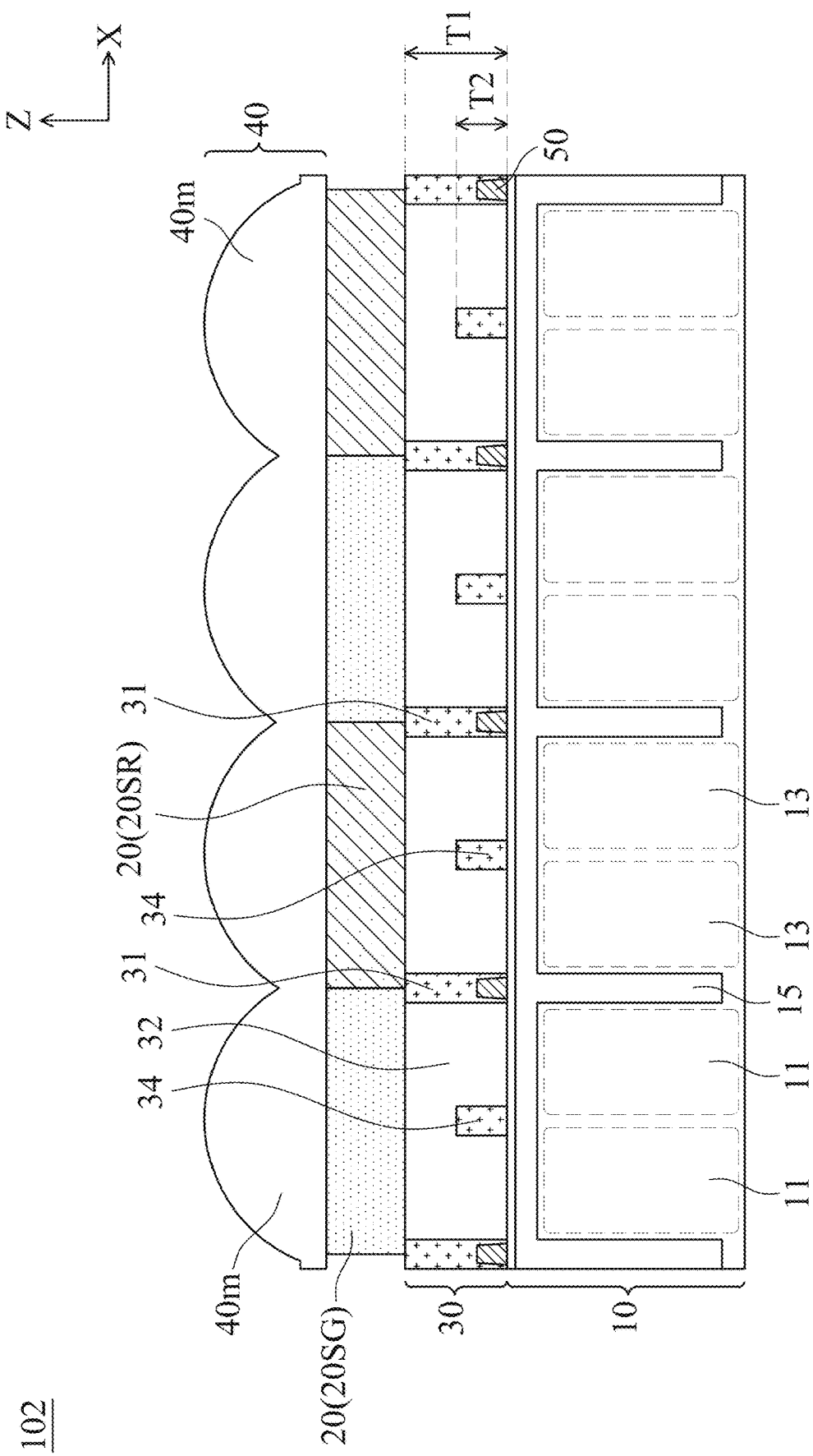
FIG. 4 is a cross-sectional view illustrating a portion of the solid-state image sensor in accordance with some embodiments of the present disclosure.
Figure 5:
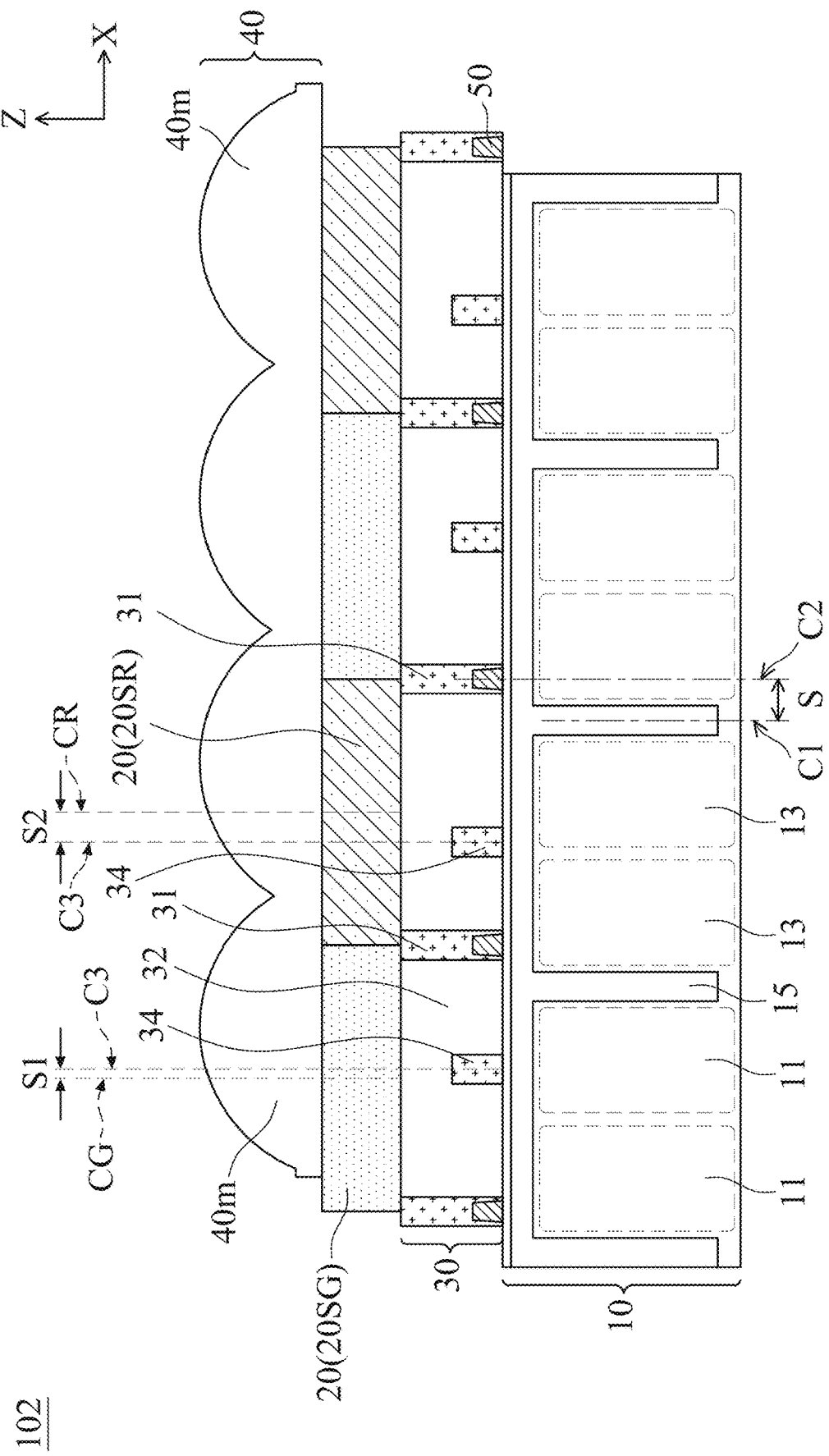
FIG. 5 is a cross-sectional view illustrating another portion of the solid-state image sensor in accordance with some embodiments of the present disclosure.

FIG. 4 is a cross-sectional view illustrating a portion of the solid-state image sensor 102 in accordance with some embodiments of the present disclosure. FIG. 5 is a cross-sectional view illustrating another portion of the solid-state image sensor 102 in accordance with some embodiments of the present disclosure. For example, FIG. 4 shows the cross-sectional view of the solid-state image sensor 102 in the center area, and FIG. 5 shows the cross-sectional view of the solid-state image sensor 102 in the edge area that surrounds the center area, but the present disclosure is not limited thereto. It should be noted that some components of the solid-state image sensor 102 may be omitted in FIG. 4 and FIG. 5 for the sake of brevity.

The solid-state image sensor 102 shown in FIG. 4 and FIG. 5 has a similar structure to the solid-state image sensor 100 shown in FIG. 1A and FIG. 2. One of the differences from the solid-state image sensor 100 shown in FIG. 1A and FIG. 2 may include that the first partition structure 31 and the second partition structure 34 of the solid-state image sensor 102 shown in FIG. 4 and FIG. 5 may have different heights. In particular, the height T2 of the second partition structure 34 may be lower than the height T1 of the first partition structure 31, but the present disclosure is not limited thereto.

Similarly, as shown in FIG. 5, the first partition structure 31 may have a shift S with respect to the isolation structure 15 in the edge area of the solid-state image sensor 102. In other words in the cross-sectional view as shown in FIG. 5, the distance between the central axial C2 of the first partition structure 31 and the central axial C1 of the isolation structure 15 may be the shift S, but the present disclosure is not limited thereto.

Moreover, as shown in FIG. 5, the second partition structure 34 may have a shift S1 with respect to the central axial CG of the green color filter segments 20SG, and have a shift S2 with respect to the central axial CR of the red color filter segments 20SR in the edge area of the solid-state image sensor 102. In other words, in the cross-sectional view as shown in FIG. 5, the distance between the central axial C3 of the second partition structure 34 and the central axial CG of the green color filter segments 20SG may be the shift S1, and the distance between the central axial C3 of the second partition structure 34 and the central axial CR of the red color filter segments 20SR may be the shift S2, but the present disclosure is not limited thereto. In some embodiments, the shift S1 and the shift S2 may be different, and both the shift S1 and the shift S2 may be different from the shift S, but the present disclosure is not limited thereto.

In the forgoing embodiments, such as the embodiment shown in FIG. 1A and FIG. 2, from the cross-sectional view of the solid-state image sensor 100, the first partition structure 31 may be divided into first partition segments 31S, the second partition structure 33 may be divided into second partition segments 33S, and each first partition segment 31S and each second partition segment 33S may have the same shape (e.g., rectangular), but the present disclosure is not limited thereto.

Figure 6:
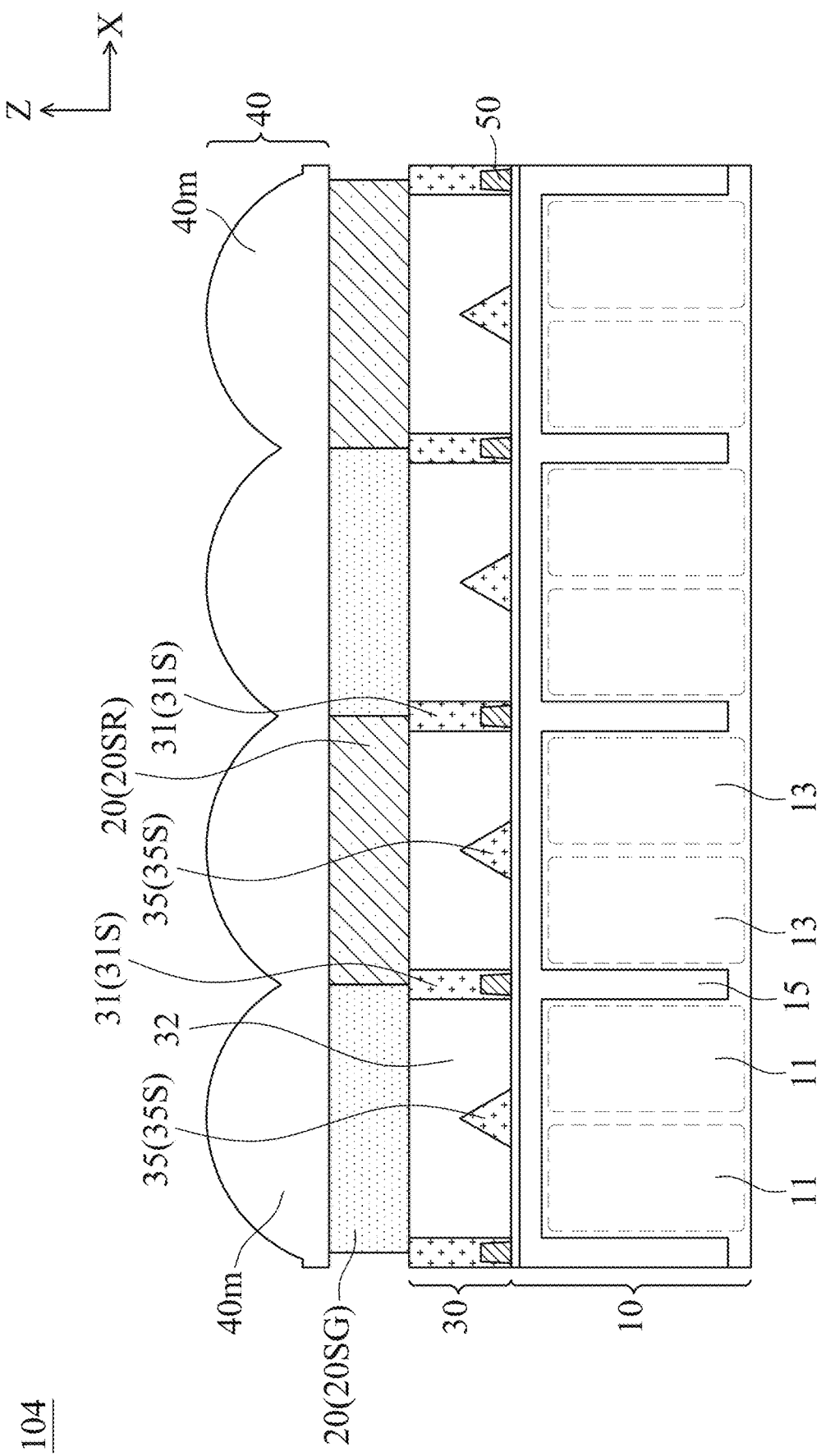
FIG. 6 is a cross-sectional view illustrating a portion of the solid-state image sensor in accordance with some embodiments of the present disclosure.
Figure 7:
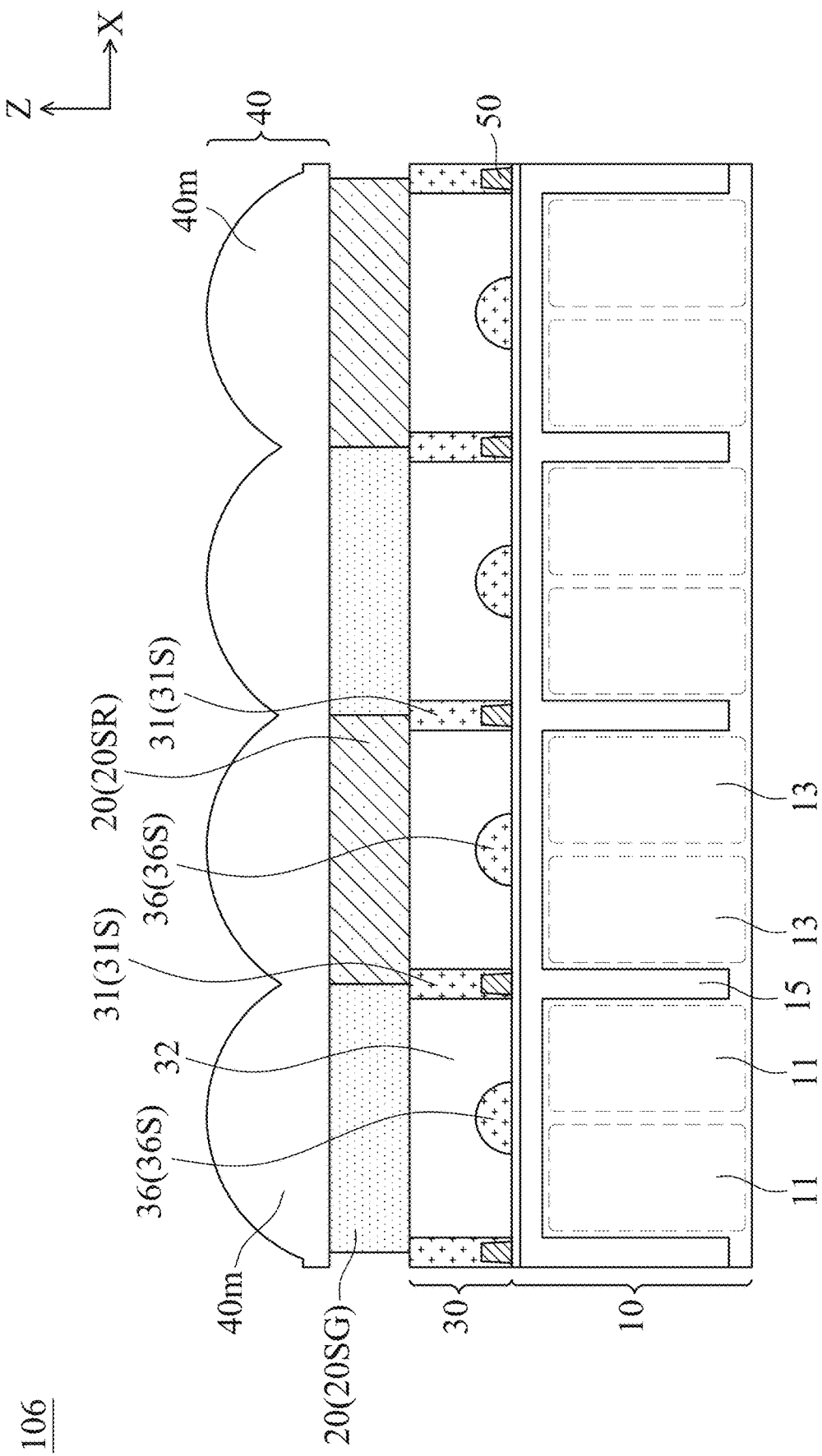
FIG. 7 is a cross-sectional view illustrating a portion of the solid-state image sensor in accordance with some other embodiments of the present disclosure.

FIG. 6 is a cross-sectional view illustrating a portion of the solid-state image sensor 104 in accordance with some embodiments of the present disclosure. FIG. 7 is a cross-sectional view illustrating a portion of the solid-state image sensor 106 in accordance with some other embodiments of the present disclosure.

As shown in FIG. 6, in the cross-sectional view of the solid-state image sensor 104, each first partition segment 31S of the first partition structure 31 may be formed into a rectangle, and each second partition segment 35S of the second partition structure 35 may be formed into a triangle, but the present disclosure is not limited thereto.

As shown in FIG. 7, in the cross-sectional view of the solid-state image sensor 106, each first partition segment 31S of the first partition structure 31 may be formed into a rectangle, and each second partition segment 36S of the second partition structure 36 may be formed into a semicircle, but the present disclosure is not limited thereto. In some embodiments, the shape of the first partition segment or the shape of the second partition segment may also be other suitable shapes, which may be adjusted depending on actual need.

Figure 8:
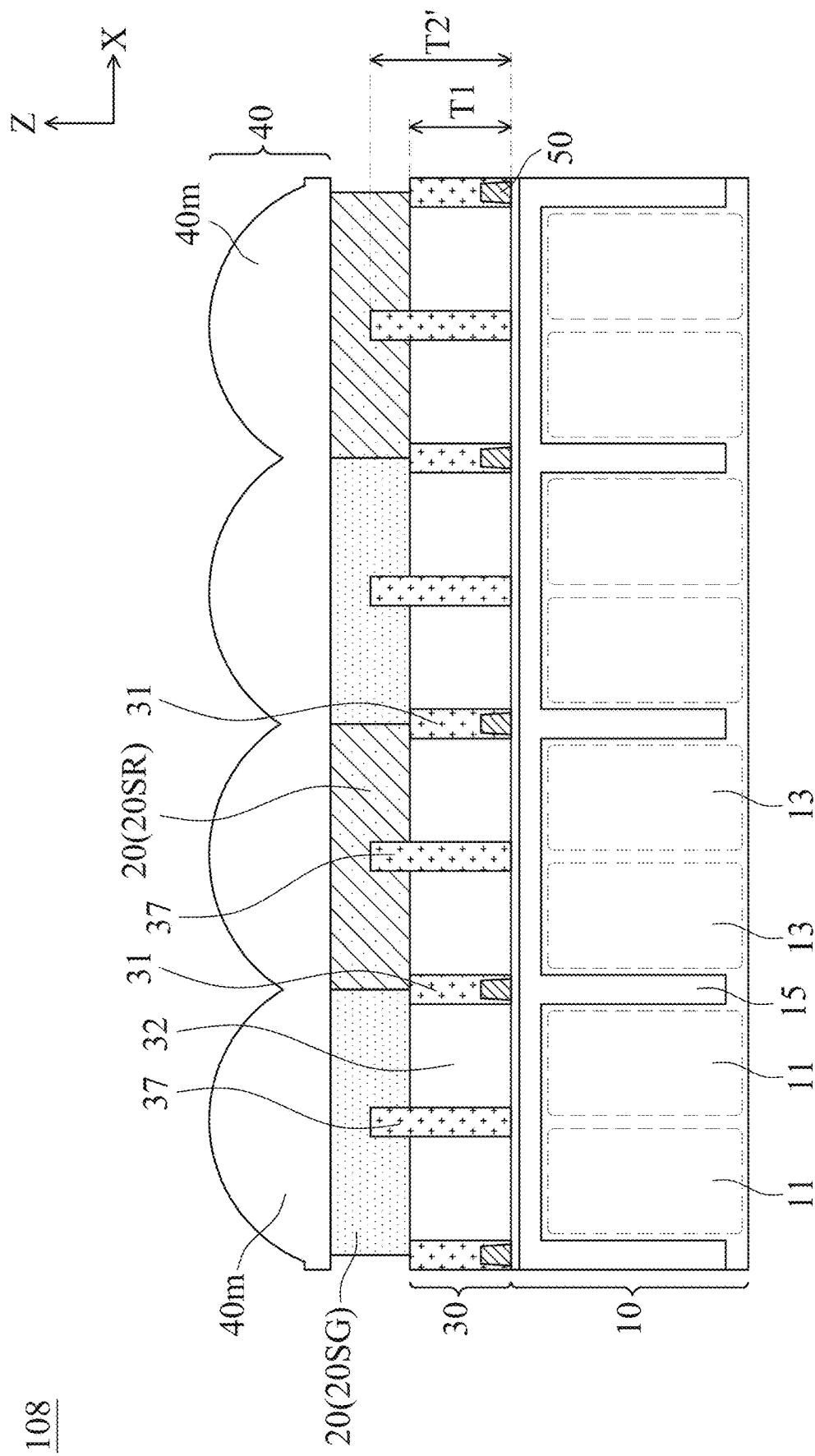
FIG. 8 is a cross-sectional view illustrating a portion of the solid-state image sensor in accordance with some embodiments of the present disclosure.

FIG. 8 is a cross-sectional view illustrating a portion of the solid-state image sensor 108 in accordance with some embodiments of the present disclosure. The solid-state image sensor 108 shown in FIG. 8 has a similar structure to the solid-state image sensor 100 shown in FIG. 1A and FIG. 2. One of the differences from the solid-state image sensor 100 shown in FIG. 1A and FIG. 2 may include that the first partition structure 31 and the second partition structure 37 of the solid-state image sensor 108 shown in FIG. 8 may have different heights. In particular, the height T2' of the second partition structure 37 may be higher than the height T1 of the first partition structure 31, but the present disclosure is not limited thereto.

In some embodiments, as shown in FIG. 8, a portion of the second partition structure 37 may be disposed inside color filter layer 20. In more detail, a portion of the second partition structure 37 may be disposed inside the green color filter segment 20SG and inside the red color filter segment 20SR, but the present disclosure is not limited thereto. In some other embodiments, a portion of the second partition structure 37 may be disposed inside other color segments of the color filter layer 20.

Figure 9:
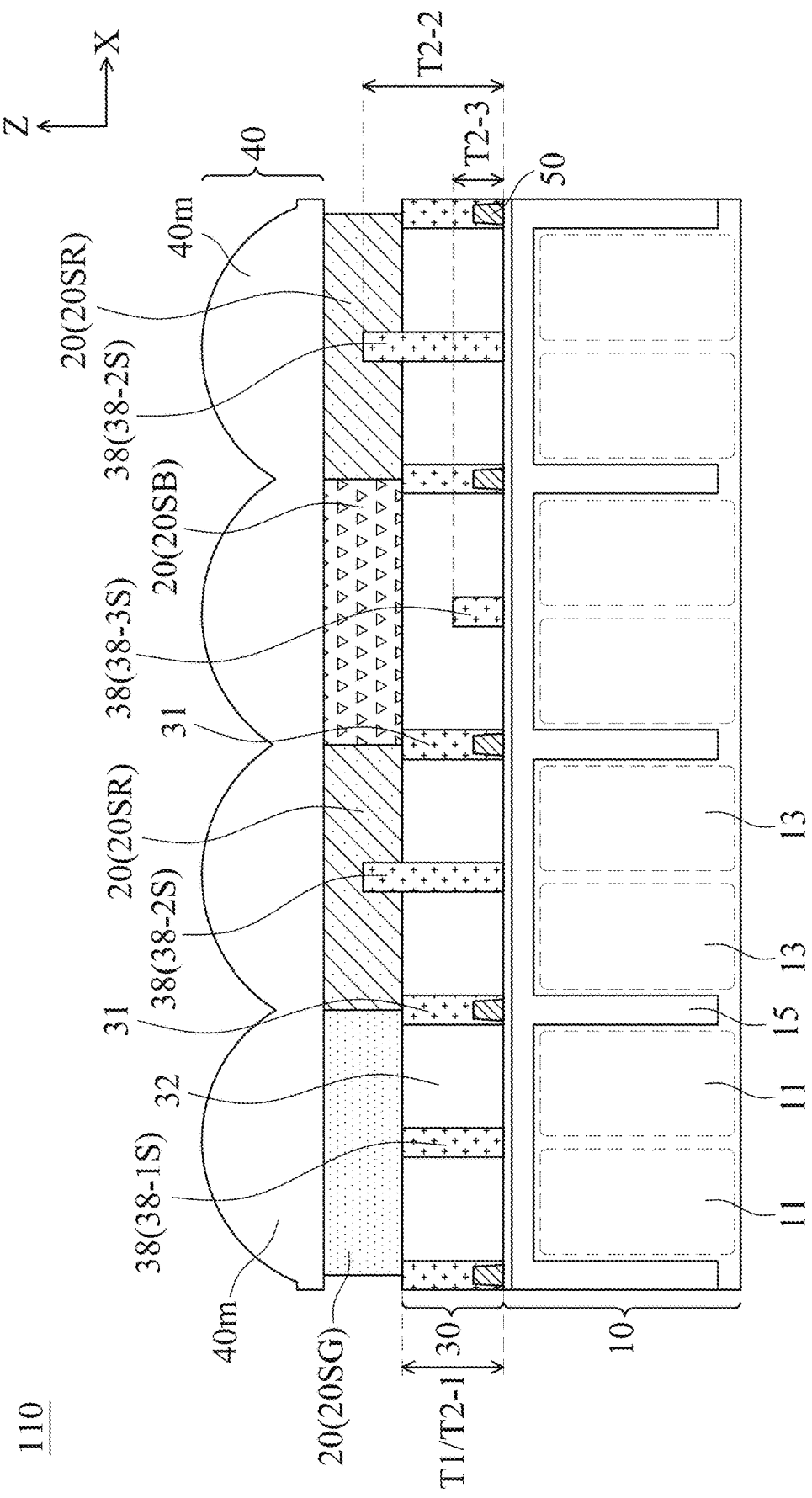
FIG. 9 is a cross-sectional view illustrating a portion of the solid-state image sensor in accordance with some embodiments of the present disclosure.

FIG. 9 is a cross-sectional view illustrating a portion of the solid-state image sensor 110 in accordance with some embodiments of the present disclosure. The solid-state image sensor 110 shown in FIG. 9 has a similar structure to the solid-state image sensor 100 shown in FIG. 1A and FIG. 2. One of the differences from the solid-state image sensor 100 shown in FIG. 1A and FIG. 2 may include that the color filter layer 20 may further have blue color filter segments 20SB.

Moreover, in this embodiment, the height of the first partition structure 31 may be constant, and the height of the second partition structure 38 may be variable. For example, as shown in FIG. 9, the height T1 of the first partition segment 31S of the first partition structure 31 may be equal to the height T2-1 of the second partition segment 38S-1 of the second partition structure 38; the height T2-1 of the second partition segment 38S-1 of the second partition structure 38 (that corresponds to the green color filter segment 20SG) may be lower than the height T2-2 of the second partition segment 38S-2 of the second partition structure 38 (that corresponds to the red color filter segment 20SR) and higher than the height T2-3 of the second partition segment 38S-3 of the second partition structure 38 (that corresponds to the blue color filter segment 20SB), but the present disclosure is not limited thereto.

Figure 10:
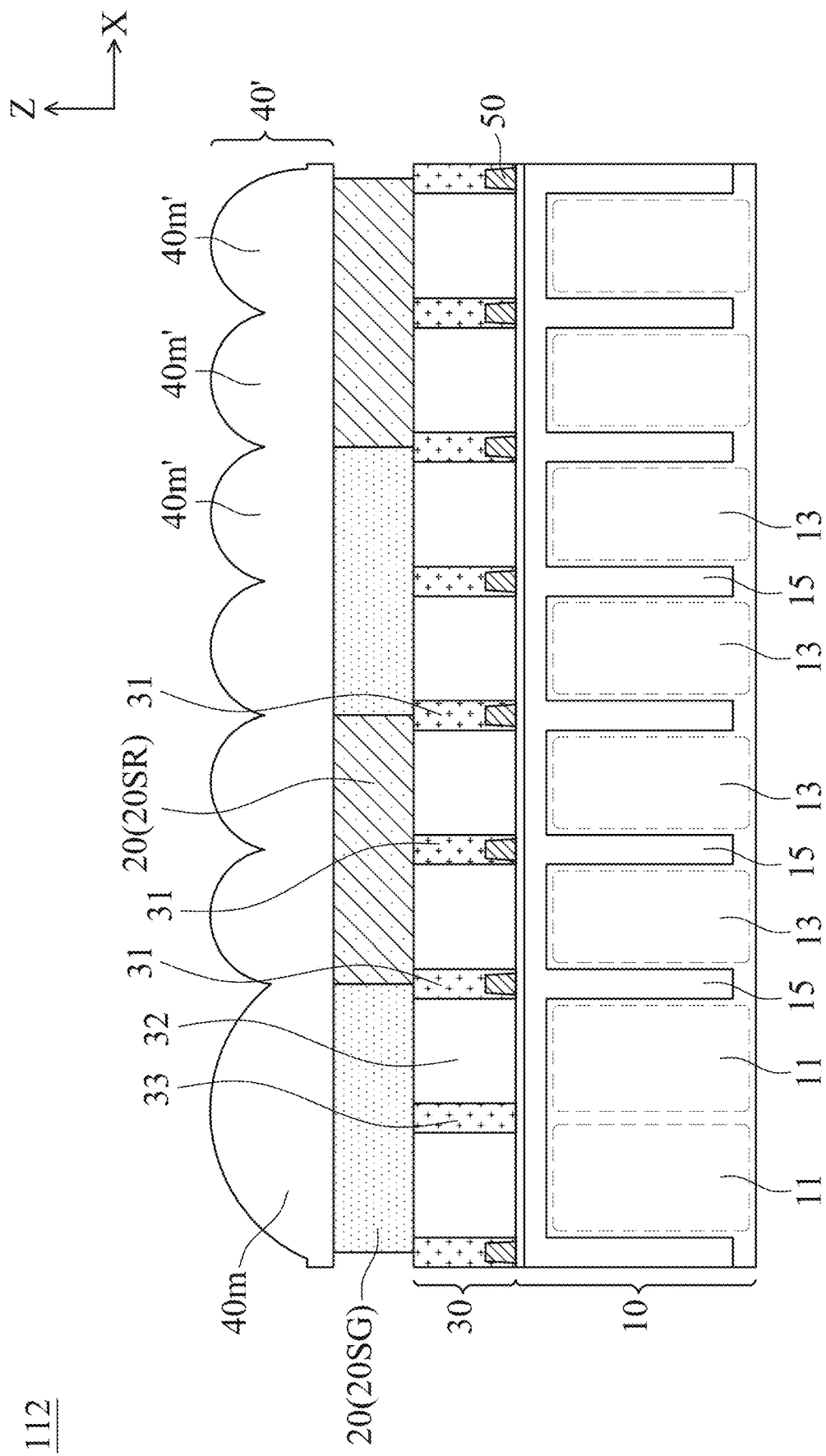
FIG. 10 is a cross-sectional view illustrating a portion of the solid-state image sensor in accordance with some embodiments of the present disclosure.

FIG. 10 is a cross-sectional view illustrating a portion of the solid-state image sensor 112 in accordance with some embodiments of the present disclosure. The solid-state image sensor 112 shown in FIG. 10 has a similar structure to the solid-state image sensor 100 shown in FIG. 1A and FIG. 2. One of the differences from the solid-state image sensor 100 shown in FIG. 1A and FIG. 2 may include that the condensing stricture 40' may include a first micro-lens 40m that corresponds to the first photoelectric conversion elements and second micro-lenses 40m' that correspond to the second photoelectric conversion elements 13.

As shown in FIG. 10, the first micro-lens 40m may correspond to at least two (i.e., two or more first photoelectric conversion elements 11, and each second micro-lens 40m' may correspond to one second photoelectric conversion element 13, but the present disclosure is not limited thereto. The number of first micro-lens 40m or the number of second micro-lens 40m' is not limited to the embodiment shown in FIG. 10, which may be adjusted depending on actual need.

In summary, the solid-state image sensor according to the embodiments of the present disclosure includes a hybrid layer disposed between the semiconductor substrate and the color filter layer, which may help to separate light from the color filter layer (color filter segment), thereby improving the uniformity of sensitivity of the photoelectric conversion elements to enhance the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
   a semiconductor substrate having first photoelectric conversion elements and at least one second photoelectric conversion element;
   an isolation structure disposed between the first photoelectric conversion elements and the at least one second photoelectric conversion element:
   a color filter layer disposed above the semiconductor substrate and having a first color filter segment corresponding to the first photoelectric conversion elements and a second color filter segment corresponding to the at least one second photoelectric conversion element; and
   a hybrid layer disposed between the semiconductor substrate and the color filter layer, and comprising:
      a first partition structure disposed to correspond to the isolation structure;
      a second partition structure surrounded by the first partition structure; and
      a transparent layer between the first partition structure and the second partition structure;
      wherein a refractive index of the first partition structure and a refractive index of the second partition structure are lower than a refractive index of the transparent layer.

2. The solid-state image sensor as claimed in claim 1, wherein a height of the second partition structure is lower than a height of the first partition structure.

3. The solid-state image sensor as claimed in claim 1, wherein from a cross-sectional view of the solid-state image sensor, the first partition structure comprises first partition segments, the second partition structure comprises second partition segments, and each of the first partition segments and each of the second partition segments have different shapes.

4. The solid-state image sensor as claimed in claim 3, wherein each of the first partition segments is formed into a rectangle, and each of the second partition segments is formed into a triangle or a semi-circle.

5. The solid-state image sensor as claimed in claim 1, wherein from a top view of the hybrid layer, the second partition structure is formed into a square, a rectangle, or two cross rectangles.

6. The solid-state image sensor as claimed in claim 1, wherein the second partition structure is in direct contact with the first partition structure.

7. The solid-state image sensor as claimed in claim 1, wherein a height of the second partition structure is higher than a height of the first partition structure.

8. The solid-state image sensor as claimed in claim 7, wherein a portion of the second partition structure is disposed inside the first color filter segment.

9. The solid-state image sensor as claimed in claim 1, wherein the semiconductor substrate has second photoelectric conversion elements, and the second partition structure corresponds to the first photoelectric conversion elements or the second photoelectric conversion elements.

10. The solid-state image sensor as claimed in claim 9, wherein the first color filter segment and the second color filter segment comprise red color filter segment, green color filter segment, blue color filter segment, yellow color filter segment, white color filter segment, cyan color filter segment, magenta color filter segment, or IR/NIR color filter segment.

11. The solid-state image sensor as claimed in claim 10, wherein a height of the first partition structure is constant, and a height of the second partition structure is variable.

12. The solid-state image sensor as claimed in claim 11, wherein the height of the second partition structure corresponding to the first color filter segment is different from the height of the second partition structure corresponding to the second color filter segment.

13. The solid-state image sensor as claimed in claim 1, further comprising:
   a condensing structure disposed on the color filter layer, wherein the condensing structure comprises a first micro-lens corresponding to the first photoelectric conversion elements and a second micro-lens corresponding to the at least one second photoelectric conversion element.

14. The solid-state image sensor as claimed in claim 13, wherein the first micro-lens corresponds to m×n first photoelectric conversion elements, and m and n are positive integers.

15. The solid-state image sensor as claimed in claim 14, wherein the second micro-lens corresponds to one second photoelectric conversion element.

16. The solid-state image sensor as claimed in claim 1, wherein the first partition structure has a shift with respect to the isolation structure in an edge area of the solid-state image sensor.

17. The solid-state image sensor as claimed in claim 1, further comprising:
 a metal grid disposed at a bottom of the first partition structure.

18. The solid-state image sensor as claimed in claim 1, wherein the refractive index of the transparent layer is greater than 1.0.

19. The solid-state image sensor as claimed in claim 1, wherein the refractive index of the first partition structure and the refractive index of the second partition structure are different.

20. The solid-state image sensor as claimed in claim 1, wherein a thickness of the hybrid layer is in a range from 0.01 μm to 2.0 μm.

\* \* \* \* \*